(12) United States Patent
Boz et al.

(10) Patent No.: US 11,437,957 B2
(45) Date of Patent: Sep. 6, 2022

(54) ACCELERATED CHANNEL SCANNING WITH A TWO-POINT-MODULATED PHASE-LOCKED LOOP

(71) Applicant: QUALCOMM Incorporated, San Diego, CA (US)

(72) Inventors: Zafer Boz, Cambridge (GB); Dhammika Bokolamulla, Cambridge (GB); Philip Jones, Cambridge (GB)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/164,592

(22) Filed: Feb. 1, 2021

(65) Prior Publication Data
US 2022/0247355 A1 Aug. 4, 2022

(51) Int. Cl.
| | | |
|---|---|---|
| H03C 3/09 | (2006.01) | |
| H03L 7/18 | (2006.01) | |
| H04B 1/10 | (2006.01) | |
| H03L 7/081 | (2006.01) | |
| H03L 7/099 | (2006.01) | |
| H03C 3/04 | (2006.01) | |
| H03L 7/10 | (2006.01) | |

(52) U.S. Cl.
CPC ............ *H03C 3/0941* (2013.01); *H03C 3/04* (2013.01); *H03C 3/095* (2013.01); *H03C 3/0925* (2013.01); *H03C 3/0933* (2013.01); *H03C 3/0958* (2013.01); *H03L 7/0814* (2013.01); *H03L 7/0992* (2013.01); *H03L 7/104* (2013.01); *H03L 7/18* (2013.01); *H04B 1/109* (2013.01); *H03L 2207/06* (2013.01); *H03L 2207/50* (2013.01)

(58) Field of Classification Search
CPC .......... H03C 3/04; H03C 3/09; H03C 3/0908; H03C 3/0916; H03C 3/0925; H03C 3/0933; H03C 3/0941; H03C 3/095; H03C 3/0958; H03L 7/104; H03L 7/12; H03L 7/18; H03L 2207/06; H03L 2207/50; H04B 1/1027; H04B 1/109; H04B 1/26; H04B 1/28; H04B 2001/1072
See application file for complete search history.

(56) References Cited

U.S. PATENT DOCUMENTS

| | | | | |
|---|---|---|---|---|
| 5,613,230 | A * | 3/1997 | Gottfried | H03G 3/3068 455/161.3 |
| 6,370,370 | B1 * | 4/2002 | Roth | H03G 3/3052 375/346 |
| 6,686,804 | B1 * | 2/2004 | Adams | H03L 7/185 331/17 |
| 8,768,280 | B2 * | 7/2014 | Sahl | H03J 7/04 455/315 |
| 2002/0039888 | A1 * | 4/2002 | Hama | H04B 1/408 455/67.13 |
| 2006/0057986 | A1 * | 3/2006 | Wakui | H04B 1/28 455/165.1 |
| 2008/0132191 | A1 * | 6/2008 | Quinlan | H03D 7/18 455/302 |

(Continued)

*Primary Examiner* — Levi Gannon
(74) *Attorney, Agent, or Firm* — Haynes & Boone, LLP

(57) ABSTRACT

A receiver is provided having a two-point-modulated phase-locked loop for the rapid scanning of the signal strength of a plurality of frequency channels. The two-point modulation includes a modulation of a frequency gain by an oscillator in the phase-locked loop and a modulation of a frequency division by a divider in the phase-locked loop.

20 Claims, 6 Drawing Sheets

(56) References Cited

U.S. PATENT DOCUMENTS

2009/0239492 A1\* 9/2009 Kuga ............... H04B 1/28
  455/260
2011/0053537 A1\* 3/2011 Nagaraj ........... H04W 52/0245
  455/208
2018/0294828 A1\* 10/2018 Matsui .............. H04B 1/16

\* cited by examiner

ACCELERATED CHANNEL SCANNING WITH A TWO-POINT-MODULATED PHASE-LOCKED LOOP

TECHNICAL FIELD

This application relates to signal strength channel scanning, and more particularly to the signal strength scanning of a plurality of frequency channels using a two-point-modulated phase-locked loop.

BACKGROUND

Wireless protocols such as Bluetooth (BT) and WiFi share bandwidth such as in the 2.4 GHz industrial, scientific, and medical (ISM) band. Since this shared use is exponentially increasing with the growing traffic load, the possibility of contention in the shared frequency band increases accordingly. The use of a congested channel by a Bluetooth device may then result in poor radio performance and data transfer. However, there are many situations such as in public places that have a high density of wireless users resulting in congested radio airways.

To limit the effects of contention, Bluetooth relies on a frequency hopping across its channels to keep a robust radio link. A Bluetooth piconet device thus scans the ISM band for interferers so that the frequency hopping may be adapted to avoid interferers on the congested channels. In the ISM band, Bluetooth Low Energy (LE) uses 40 channels (sub-bands) for the frequency hopping whereas classic Bluetooth uses 79 channels. A Bluetooth device thus scans across these channels so that non-interfered channels may be selected for the transmission of data packets. This scanning should happen regularly without interrupting the firmware high-priority packet traffic activity and resources. Success and robustness of the scanning depends on firmware time resource allocation and the hardware dynamic measurement capability. But existing Bluetooth scanning techniques are restrictive for the current Bluetooth hardware technology.

SUMMARY

In accordance with a first aspect of the disclosure, a receiver is provided that includes: a phase-locked loop configured to generate a local oscillator signal responsive to a two-point modulation; a mixer configured to mix a radio frequency signal with the local oscillator signal to produce a down-converted signal; a signal strength measurement circuit configured to measure a signal strength of the down-converted signal; and a baseband controller configured to adjust the two-point modulation to perform a signal strength scan over a plurality of channels in the radio frequency signal.

In accordance with a second aspect of the disclosure, a method of scanning Bluetooth channels is provided that includes: performing a first two-point modulation of a phase-locked loop responsive to a first value of a frequency command to produce a first local oscillator signal having a frequency of a first Bluetooth channel; mixing a first radio frequency signal with the first local oscillator signal to produce a first down-converted signal; and measuring a signal strength of the first down-converted signal to determine a signal strength of the first Bluetooth channel.

In accordance with a third aspect of the disclosure, a method is provided that includes: modulating a frequency gain of an oscillator in a phase-locked loop to equal a first frequency gain to produce a first local oscillator signal having a frequency of a first Bluetooth channel; modulating a frequency division in the phase-locked loop to keep the phase-locked loop in lock during the modulating of the frequency gain to equal the first frequency gain; mixing a radio frequency signal with the first local oscillator signal during a first measurement period to produce a first down-converted signal; and measuring a signal strength of the first down-converted signal to measure a signal strength of the first Bluetooth channel.

In accordance with a fourth aspect of the disclosure, a Bluetooth receiver is provided that includes: an oscillator configured to produce a local oscillator signal at a frequency that is a function of a frequency gain that is responsive to a frequency command; and a divider configured to divide the local oscillator signal in frequency according to a divisor that is responsive to the frequency command to produce a divided signal; a mixer for mixing the local oscillator signal with a radio frequency signal to produce a down-converted signal; and a signal strength measurement circuit configured to measure a signal strength of the down-converted signal to determine a signal strength of a Bluetooth channel including the frequency.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figure.

DETAILED DESCRIPTION

The following discussion is directed to channel signal strength scanning by a Bluetooth receiver to detect the presence of congested channels. However, it will be appreciated that the channel scanning disclosed herein may be employed by other wireless protocols such as WiFi that need to determine whether frequency channels are suitably free of interference for data transmission. The following discussion will thus be directed to a Bluetooth receiver without loss of generality. Bluetooth channels are arranged in the ISM band from 2402 MHz (2.402 GHz) to 2480 MHz (2.480 GHz). The channels at 2402 MHz, 2426 MHz, and 2480 MHz are advertising channels. The remaining channels are data channels over which a Bluetooth transmitter performs its frequency hopping to transmit data. The Bluetooth signal strength scan disclosed herein may thus be limited to the data channels although in alternative embodiments the advertising channels may also be included within the scan.

In a conventional Bluetooth scan, a Bluetooth receiver generates a local oscillator (LO) signal such as through a phase-locked loop (PLL). The receiver tunes the PLL to generate an LO signal at the frequency of the scanned channel. The PLL must then lock to the new channel frequency, which requires an appreciable amount of time. Each additional channel being scanned requires another locking of the PLL to the new channel's frequency. The resulting delay is problematic for conventional Bluetooth receivers.

Figure 1:
FIG. 1 is an example channel occupancy map for the ISM channel in the presence of three WiFi interferers.

To better appreciate the challenge of scanning Bluetooth channels for congestion, a channel occupancy map is shown in FIG. 1 as produced by a Bluetooth sniffing device that measured the signal strength of the data channels in the presence of three WiFI interferers each transmitting at −30 dBm at a 20% duty cycle over a 130 second time period. The non-interfered portion of the channels are cross-hatched whereas an interfered portion 100 of the channels is left blank. A measurement such as through a received signal strength indicator (RSSI) measurement determines whether the signal strength (interference) in the interfered portion 100 of the data channels exceeds a threshold interference value. The threshold interference value has a magnitude such that transmission in the interfered portion 100 of the data channels would require re-transmission and result in poor user experience. It is thus beneficial to scan across the data channels so that the Bluetooth frequency hopping can be adapted to avoid the interfered portion 100. To provide an accurate map of the channel occupancy, the Bluetooth scan may occur within a Bluetooth slot time of 625 µs. But in a conventional Bluetooth scan, the need to re-lock a PLL at each channel frequency causes the scan delay to extend across multiple packets (for example, twenty times the standard packet delay). As a result, conventional Bluetooth transmission may be subjected to substantial channel contention as the scan cannot be repeated at a sufficient pace to accommodate the random nature of the interfered portion 100.

A two-point modulation scheme for a PLL is disclosed that enables a Bluetooth receiver to rapidly scan each channel. The following discussion will be directed to the measurement of the data channel energy without loss of generality such that the term "channel" without further modification will be understood to refer to a data channel. However, the scanning disclosed herein is also applicable to the energy measurement of an advertising channel should such a measurement be desired. In the disclosed two-point modulation, the PLL remains locked as it is tuned from one channel to the next. There is thus no delay in the transition from one channel to another for the PLL to lock to the new channel's frequency. This is quite advantageous as the locking delay may exceed the time necessary to perform the channel energy measurement. In the scan disclosed herein, the PLL need only be locked for the initial channel energy measurement because the PLL remains locked in the transition to other channels. Should the scan extend beyond the range of the two-point modulation, the PLL may need to be re-locked before scanning additional channels but such an additional re-lock of the PLL will still result in markedly reduced scan times as compared to a conventional Bluetooth channel scan.

Figure 2:
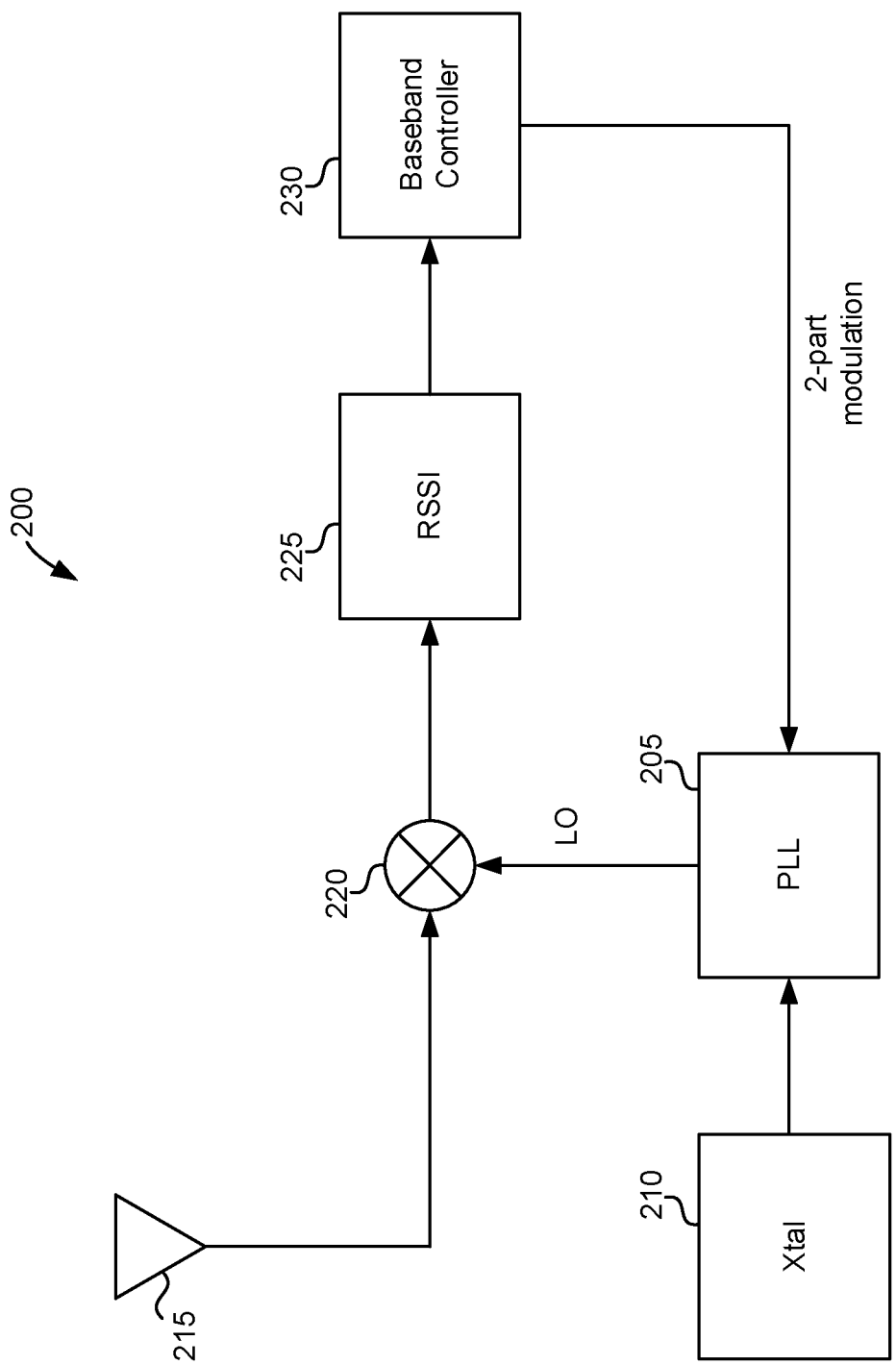
FIG. 2 is a diagram of an example Bluetooth receiver including a two-point-modulated phase-locked loop for the scanning of the ISM channel in accordance with an aspect of the disclosure.

The disclosed two-point modulation is applied to the phase portion of a polar-modulated transmitter and receiver (transceiver). In polar modulation, there is an amplitude path and a phase path that are combined to produce a modulated signal. The amplitude path will not be discussed as it is not relevant to the frequency tuning for the LO signal produced by the PLL. An example receiver 200 is shown in FIG. 2. A baseband Bluetooth controller 230 controls a two-point modulation applied to a PLL 205 so that a LO signal produced by the PLL 205 has the desired frequency corresponding to the channel being measured. An antenna 215 receives an RF signal that is mixed in a mixer 220 with the LO signal to produce a baseband signal that is measured by an RSSI circuit 225. It will be appreciated that other types of signal strength measurements besides RSSI may be used in alternative embodiments. The RSSI circuit 225 may be integrated within baseband controller 230 in alternative embodiments. The PLL 205 generates the LO signal responsive to the two-point modulation and a reference signal such as from a crystal oscillator (Xtal) 210. Based upon the signal energy that is measured in each channel by the RSSI circuit 225, the baseband controller 230 controls the frequency hopping during a data transmission phase following the completed scan.

Figure 3:
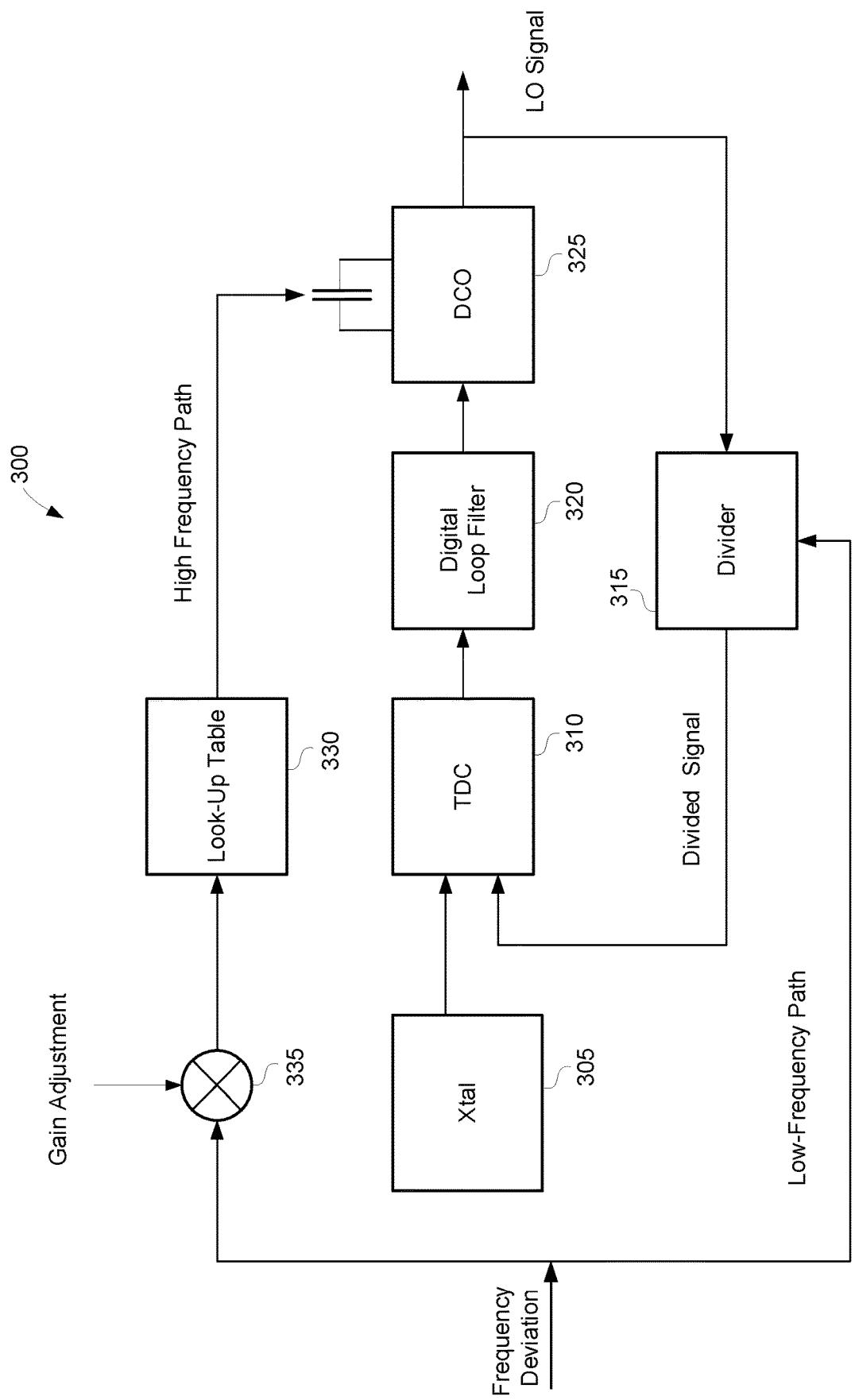
FIG. 3 is a diagram of an example digital phase-locked loop for the receiver of FIG. 2 in accordance with an aspect of the disclosure.

The two-point modulation for PLL 205 may be with respect to a digital phase-locked loop or an analog phase-locked loop. An example digital phase-locked loop 300 with two-point modulation is shown in FIG. 3 in which a digitally-controlled oscillator (DCO) 325 generates an LO signal at the desired channel frequency responsive to a frequency deviation command. For brevity, the frequency deviation command will be referred to as a frequency command in the following discussion. The frequency command adjusts a frequency division by a divider 315 of the LO signal so that a divided signal from divider 315 has the frequency of a reference clock signal. In particular, divider 315 divides the LO signal in frequency according to divisor that is modulated by the frequency command. A reference oscillator such as a crystal oscillator (Xtal) 305 generates the reference clock signal. A time-to-digital converter (TDC) 310 converts a phase difference (the time delay between corresponding clock edges) into a digital code. For example, TDC 310 may convert the time delay between a rising edge of the reference clock signal and a corresponding rising edge of the divided LO signal into the digital code. A digital loop filter 320 filters the digital code to produce a digital control signal that controls the oscillation frequency of DCO 325.

When the error (the time delay between corresponding edges) between the divided signal and the reference clock signal reaches a steady state value, the digital phase-locked loop 300 is deemed to be locked. Although the LO signal has a frequency equal to the targeted Bluetooth channel as controlled by the frequency command, a corresponding edge of the LO signal will also be aligned or synchronous with a corresponding edge of the reference clock signal when the digital phase-locked loop 300 is locked.

Digitally-controlled oscillator 325 has a frequency gain such that the frequency of the LO signal is proportional to the digital control signal from digital loop filter 320. As the digital control signal changes prior to the lock of the digital phase-locked loop 300, the frequency of LO signal changes proportionally to a function (e.g., the product) of the digital control signal and the frequency gain of the digital phase-locked loop 300. To provide the desired frequency deviation to a new channel frequency, the frequency command also modulates the frequency gain of DCO 325. For example, the frequency command may change a capacitance of DCO 325 to vary its frequency gain. But note that this frequency gain control is not as mathematically precise as changing the frequency division by divider 315 when the digital phase-locked loop is two-point modulated to vary the LO signal frequency from one Bluetooth channel frequency to another. In that regard, the division is mathematically determined by the desired LO signal frequency and the reference clock signal frequency. In particular, the frequency division by divider 315 may equal a ratio of the desired LO signal frequency and the reference clock signal frequency. The frequency command many thus simply equal this ratio to control (modulate) divider 315. But due to the analog relationship between the capacitance change and the frequency gain of DCO 325, the frequency command is mapped to the corresponding frequency gain such as by multiplying the frequency command by a gain adjustment at a multiplier 335 to produce a product that drives a lookup table 330. The lookup table 330 then produces an appropriate capacitance adjustment to DCO 325. For example, the lookup table 330 and the gain adjustment may be calibrated periodically to provide the desired mapping of the frequency command to the modulation of the frequency gain for DCO 325. In other embodiments, the frequency gain may be tuned in alternative fashions such as by a change in resistance or in inductance for DCO 325 (or by a combination of these factors).

With the digital phase-locked loop 300 locked to an initial channel frequency, a frequency deviation through the two-point modulation does not affect the lock. For example, suppose that the frequency deviation is positive so that the LO signal frequency is increased to equal a new Bluetooth channel frequency. Simultaneously with this increase in the LO signal frequency, the frequency division by divider 315 is increased proportionally such that the error between the divided signal and the reference clock signal remains in the steady state condition. During steady state (locked) operation, note that the digital control signal from the digital loop filter 320 has a corresponding steady state value. This steady state value for the digital control signal is not zero as DCO 325 needs a non-zero control signal to produce the LO signal. The mapping by the gain adjustment at multiplier 335 and in lookup table 330 thus is such that the resulting frequency gain in DCO 325 as applied to the steady state digital control signal produces the desired LO signal frequency.

In a first point of the two-point modulation, the modulation of the frequency gain in DCO 325 such as by modulating its capacitance may be deemed to be produced by a high-frequency path since it is directly affecting the LO signal frequency. In a second point of the two-point modulation, the modulation of the frequency division by divider 315 such as by modulating its divisor may be deemed to be produced by a low-frequency path since it is adjusting the frequency of the divided signal.

Figure 4:
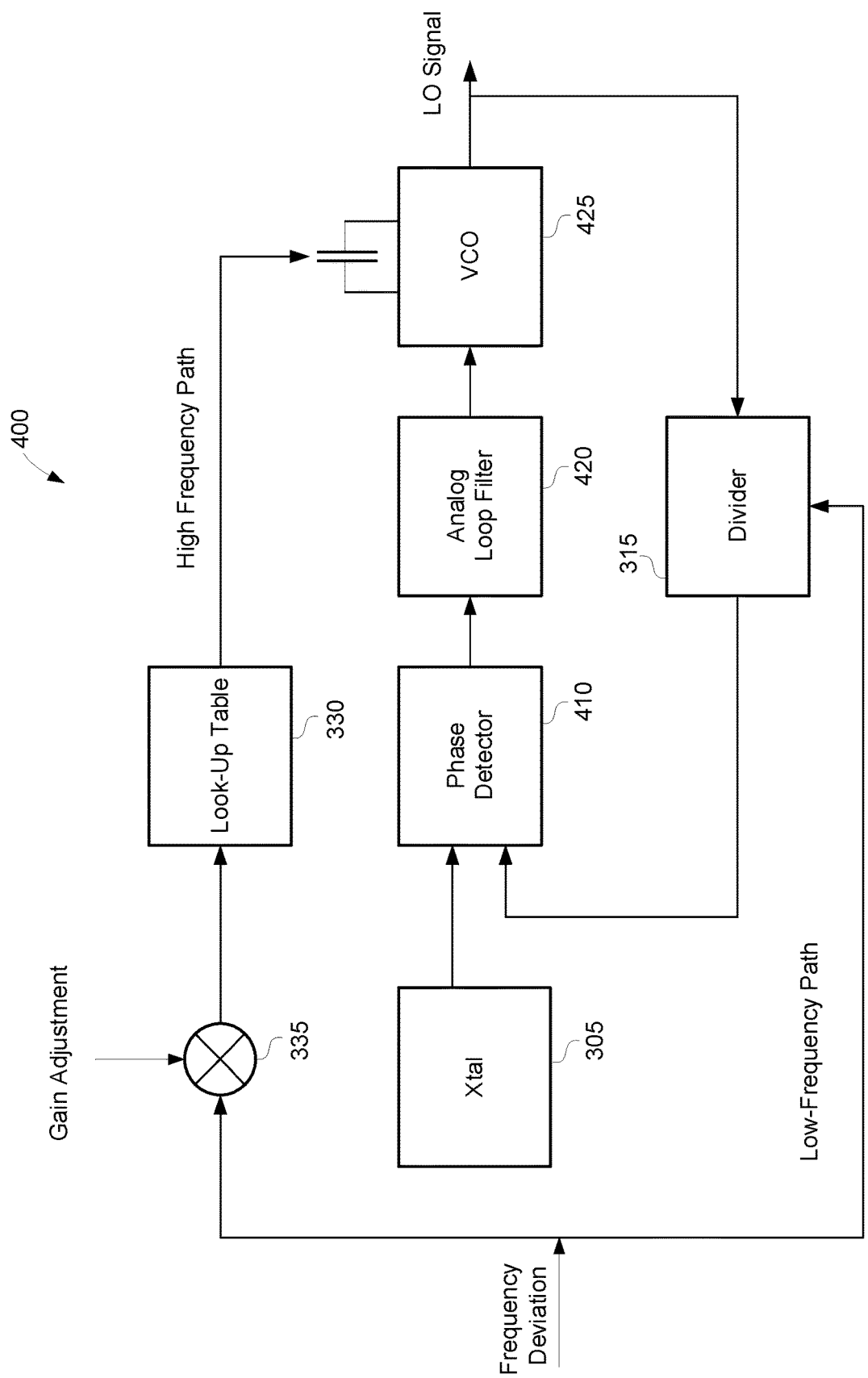
FIG. 4 is a diagram of an example analog phase-locked loop for the receiver of FIG. 2 in accordance with an aspect of the disclosure.

As noted earlier, the two-point modulation to PLL 205 may also be with respect to an analog phase-locked loop. An example analog phase-locked loop 400 with two-point modulation is shown in FIG. 4 in which a voltage-controlled oscillator (VCO) 425 produces the LO signal. As discussed with regard to digital phase-locked loop 300, a divider 315 responds to the low-frequency path modulation as controlled by the frequency command to divide the LO signal in frequency into the divided signal. A phase detector 410 detects a phase difference between the divided signal and the reference clock signal from the crystal oscillator 305. An analog loop filter 420 filters the phase difference to produce a control voltage that controls the oscillation frequency of VCO 425. As discussed for DCO 325, a high frequency path as is formed by the gain adjustment at multiplier 335 and lookup table 330 converts the frequency command into the appropriate capacitance control of VCO 425 so that the LO signal frequency equals the desired Bluetooth channel frequency.

Figure 5:
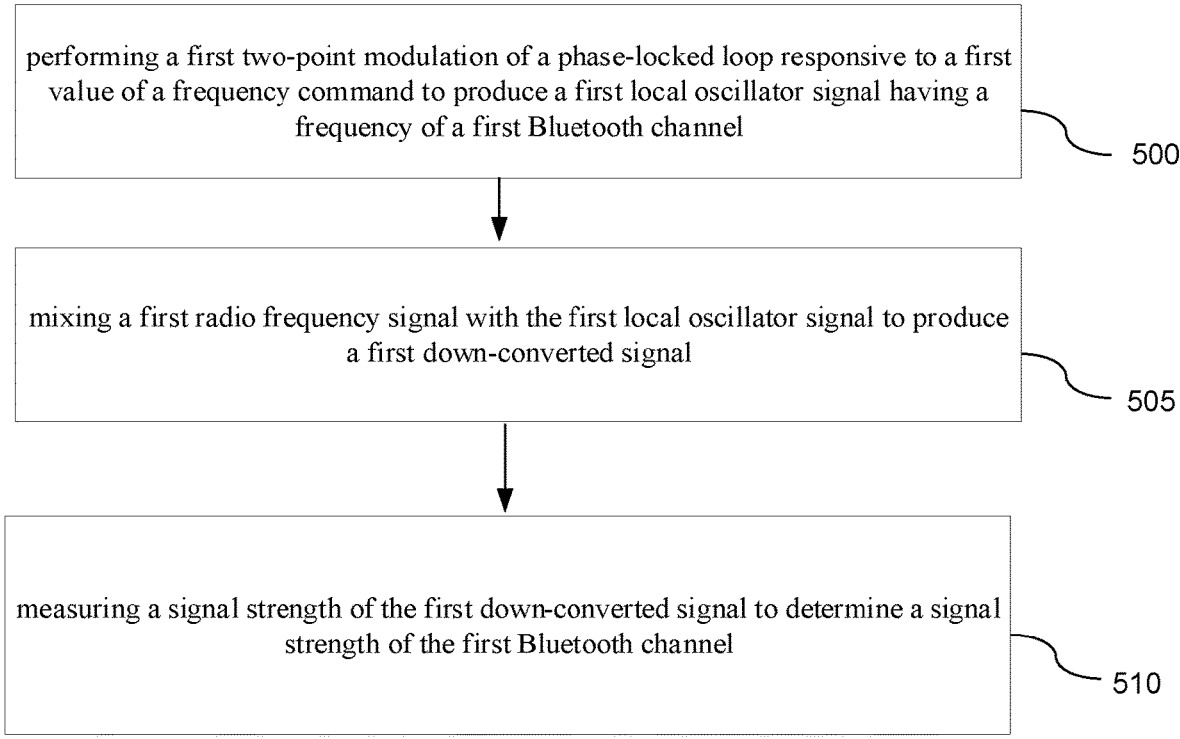
FIG. 5 is a flowchart for an example method of scanning the signal strength of Bluetooth channels using a two-point-modulated phase-locked loop in accordance with an aspect of the disclosure.

A method of using a two-point modulation to scan the signal strength of a Bluetooth channel will now be discussed with reference to the flowchart of FIG. 5. The method includes an act 500 of performing a first two-point modulation of a phase-locked loop responsive to a first value of a frequency command to produce a first local oscillator signal having a frequency of a first Bluetooth channel. Modulating either the digital phase-locked loop 300 or the analog phase-locked loop 400 responsive to a first value of the frequency command is an example of act 500. In addition, the method includes an act 505 of mixing a first radio frequency signal with the first local oscillator signal to produce a first down-converted signal. The mixing in mixer 220 is an example of act 505. Finally, the method includes an act 510 of measuring a signal strength of the first down-converted signal to determine a signal strength of the first Bluetooth channel. The RSSI measurement in RSSI circuit 225 is an example of act 510.

Figure 6:
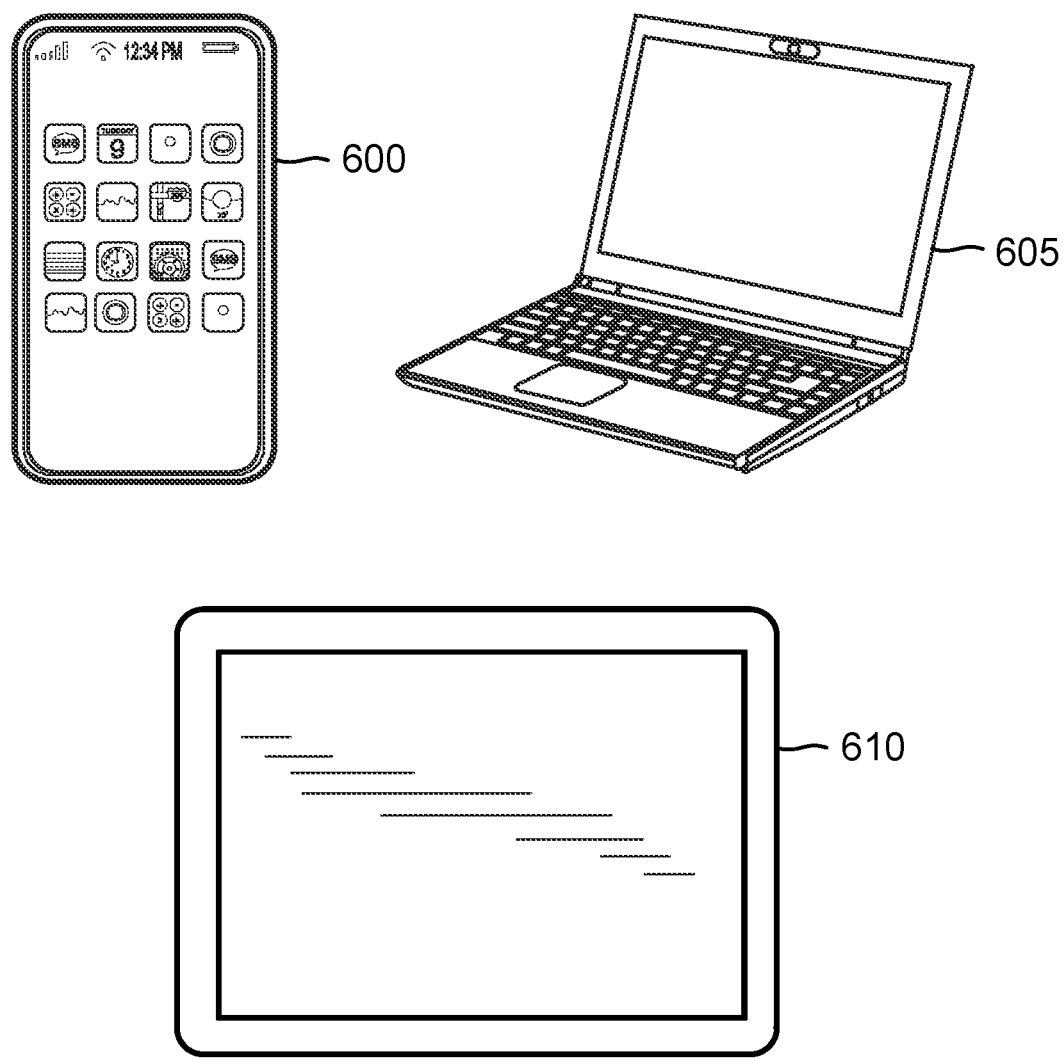
FIG. 6 illustrates some example electronic devices including a Bluetooth receiver in accordance with an aspect of the disclosure.

A Bluetooth receiver with an advantageously-accelerated channel scanning as disclosed herein may be incorporated in any suitable mobile device or electronic system. For example, as shown in FIG. 6, a cellular telephone 600, a laptop computer 605, and a tablet PC 610 may all include a Bluetooth receiver in accordance with the disclosure. Other exemplary electronic systems such as a music player, a video player, a communication device, and a personal computer may also be configured with Bluetooth receivers constructed in accordance with the disclosure.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A receiver, comprising:
   a phase-locked loop including an oscillator configured to generate a local oscillator signal, wherein the oscillator is further configured to respond to a control signal according to a frequency gain that is responsive to a frequency deviation command to control a frequency of the local oscillator signal, the phase-locked loop also including a divider configured to divide the local oscillator signal responsive to the frequency deviation command;
   a mixer configured to mix a radio frequency signal with the local oscillator signal to produce a down-converted signal;
   a signal strength measurement circuit configured to measure a signal strength of the down-converted signal; and
   a baseband controller configured to adjust the frequency deviation command to perform a signal strength scan over a plurality of channels for the radio frequency signal.

2. The receiver of claim 1, wherein the baseband controller is a Bluetooth baseband controller.

3. The receiver of claim 2, further comprising:
   a crystal oscillator configured to generate a reference signal;

a time-to-digital converter configured to provide a digital code responsive to a delay between the reference signal and a divided signal from the divider; and a digital loop filter configured to filter the digital code to provide the control signal.

4. The receiver of claim 3, wherein the phase-locked loop is a digital phase-locked loop.

5. The receiver of claim 4, wherein the oscillator comprises a digitally-controlled oscillator.

6. The receiver of claim 1, wherein the phase-locked loop is an analog phase-locked loop.

7. The receiver of claim 6, wherein the oscillator comprises a voltage-controlled oscillator, the analog phase-locked loop further including:

a crystal oscillator configured to generate a reference signal;

a phase detector configured to detect a phase difference between a divided signal from the divider and the reference signal; and an analog loop filter configured to filter the phase difference to generate the control signal.

8. The receiver of claim 1, wherein the signal strength measurement circuit is a received signal strength indicator circuit.

9. A method of scanning Bluetooth channels, comprising:

adjusting a frequency gain of an oscillator to produce a first local oscillator signal in a phase-locked loop based upon a first value of a frequency deviation command while adjusting a division of the first local oscillator signal in a divider in the phase-locked loop based upon the first value of the frequency deviation command;

mixing a radio frequency signal with the first local oscillator signal to produce a first down-converted signal; and measuring a signal strength of the first down-converted signal to determine a signal strength of the first Bluetooth channel.

10. The method of claim 9, further comprising:

adjusting a frequency gain of the oscillator to produce a second local oscillator signal in the phase-locked loop based upon a second value of the frequency deviation command while adjusting a division of the second local oscillator signal in the divider in the phase-locked loop based upon the second value of the frequency deviation command;

mixing the radio frequency signal with the second local oscillator signal to produce a second down-converted signal; and measuring a signal strength of the second down-converted signal to determine a signal strength of the second Bluetooth channel.

11. The method of claim 10, wherein the phase-locked loop remains locked during a transition of the frequency command from the first value to the second value.

12. The method of claim 10, wherein measuring the signal strength of the first down-converted signal comprises performing a received signal strength indicator measurement of the first down-converted signal.

13. A method, comprising:

modulating a frequency gain of an oscillator in a phase-locked loop to equal a first frequency gain responsive to a first value of a frequency deviation command to produce a first local oscillator signal having a frequency of a first Bluetooth channel;

modulating a frequency division by a divider in the phase-locked loop responsive to the first value of the frequency deviation command to keep the phase-locked loop in lock during the modulating of the frequency gain to equal the first frequency gain;

mixing a radio frequency signal with the first local oscillator signal during a first measurement period to produce a first down-converted signal; and measuring a signal strength of the first down-converted signal to measure a signal strength of the first Bluetooth channel.

14. The method of claim 13, further comprising:

modulating the frequency gain of the oscillator from the first frequency gain to a second frequency gain responsive to a second value of the frequency deviation command to provide a second local oscillator signal having a frequency of a second Bluetooth channel;

modulating the frequency division by the divider in the phase-locked loop responsive to the second value of the frequency deviation command to keep the phase-locked loop in lock during the modulating of the frequency gain to equal the second frequency gain;

mixing the radio frequency signal with the second local oscillator signal during a second measurement period to produce a second down-converted signal; and measuring a signal strength of the second down-converted signal to measure a signal strength of the second Bluetooth channel.

15. The method of claim 13, further comprising:

determining whether the first Bluetooth channel has interference based upon the measuring of the signal strength in the first Bluetooth channel.

16. The method of claim 15, further comprising:

adjusting a frequency hopping for a Bluetooth data transmission to avoid the first Bluetooth channel responsive determining that the first Bluetooth channel has interference.

17. The method of claim 13, wherein the measuring of the signal strength of the first down-converted signal comprises performing a received signal strength indicator measurement of the first down-converted signal.

18. A Bluetooth receiver, comprising:

an oscillator configured to produce a local oscillator signal at a frequency that is a function of a frequency gain that is responsive to a frequency gain command; and a divider configured to divide the local oscillator signal in frequency according to a divisor that is responsive to a frequency deviation command to produce a divided signal;

a multiplier configured to multiply the frequency deviation command with a gain adjustment to produce a product;

a lookup table configured to map the product into the frequency gain command;

a mixer for mixing the local oscillator signal with a radio frequency signal to produce a down-converted signal; and a signal strength measurement circuit configured to measure a signal strength of the down-converted signal to determine a signal strength of a Bluetooth channel including the frequency.

19. The Bluetooth receiver of claim 18, wherein the oscillator is a digitally-controlled oscillator having an adjustable capacitance responsive to the high frequency gain command.

20. The Bluetooth receiver of claim 18, wherein the oscillator is a voltage-controlled oscillator having an adjustable capacitance responsive to the high frequency gain command.

* * * * *